(12) United States Patent
Nakamura et al.

(10) Patent No.: US 10,191,274 B2
(45) Date of Patent: *Jan. 29, 2019

(54) IMAGE DISPLAY APPARATUS

(71) Applicant: RICOH COMPANY, LTD., Tokyo (JP)

(72) Inventors: Naoki Nakamura, Saitama (JP);
Daisuke Ichii, Kanagawa (JP);
Hiromichi Atsuumi, Kanagawa (JP);
Naoki Miyatake, Kanagawa (JP); Yuki Hayashi, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/496,868

(22) Filed: Apr. 25, 2017

(65) Prior Publication Data

US 2017/0227761 A1 Aug. 10, 2017

Related U.S. Application Data

(63) Continuation of application No. 15/066,448, filed on Mar. 10, 2016, now Pat. No. 9,864,195.

(30) Foreign Application Priority Data

Mar. 11, 2015 (JP) ................................ 2015-047887

(51) Int. Cl.
*G02B 26/10* (2006.01)
*G02B 27/01* (2006.01)
(Continued)

(52) U.S. Cl.
CPC .......... *G02B 26/126* (2013.01); *G02B 26/10* (2013.01); *G02B 26/105* (2013.01); *G02B 27/01* (2013.01);
(Continued)

(58) Field of Classification Search
CPC .. G09G 5/00; G03B 21/2013; B81B 2201/04; B81B 2201/042; B60K 2350/2052;
(Continued)

(56) References Cited

U.S. PATENT DOCUMENTS

| 4,348,187 A | 9/1982 | Dotsko |
| 6,266,194 B1 | 7/2001 | Tanijiri et al. |

(Continued)

FOREIGN PATENT DOCUMENTS

| EP | 3 012 681 A1 | 4/2016 |
| EP | 3 1042 12 A2 | 12/2016 |

(Continued)

OTHER PUBLICATIONS

U.S. Appl. No. 14/885,246, filed Oct. 16, 2015.
(Continued)

*Primary Examiner* — Loha Ben
(74) *Attorney, Agent, or Firm* — Oblon, McClelland, Maier & Neustadt, L.L.P.

(57) ABSTRACT

An image display apparatus includes a light source device including a light source unit; a scanning optical system including an image forming unit on which an intermediate image is formed by light from the light source unit; and a virtual image optical system configured to guide light of the intermediate image by using a reflecting mirror and a curved transmissive reflection member. The scanning optical system includes an optical scanning unit configured to scan the light from the light source unit in a main scanning direction and a sub-scanning direction of the image forming unit. The image forming unit is a transmissive member curved with a convex surface toward the reflecting mirror.

9 Claims, 12 Drawing Sheets

(51) Int. Cl.
  *G02B 27/14* (2006.01)
  *G09G 5/00* (2006.01)
  *G02B 26/12* (2006.01)
  *G02B 27/10* (2006.01)

(52) U.S. Cl.
  CPC ........ *G02B 27/104* (2013.01); *B81B 2201/04* (2013.01); *B81B 2201/042* (2013.01); *G02B 27/0101* (2013.01); *G02B 2027/011* (2013.01); *G02B 2027/013* (2013.01); *G02B 2027/0141* (2013.01); *G02B 2027/0145* (2013.01); *G09G 5/00* (2013.01)

(58) Field of Classification Search
  CPC .......... B60K 2350/941; G02B 26/0858; G02B 26/10; G02B 26/101; G02B 26/105; G02B 26/126; G02B 27/01; G02B 27/0101; G02B 27/0149; G02B 27/0179; G02B 27/104; G02B 27/14; G02B 27/144; G02B 2027/013; G02B 2027/0141; G02B 2027/011; G02B 2027/0145
  USPC .......... 359/201.2, 202.1, 290, 291, 629–632, 359/634; 345/7–9
  See application file for complete search history.

(56) References Cited

U.S. PATENT DOCUMENTS

| | | | | |
|---|---|---|---|---|
| 6,396,461 | B1* | 5/2002 | Lewis | G02B 27/0093 345/7 |
| 6,989,934 | B2* | 1/2006 | Aoki | B60K 35/00 345/7 |
| 8,766,879 | B2* | 7/2014 | Fujikawa | G02B 27/0101 345/7 |
| 8,876,294 | B2* | 11/2014 | Saisho | G02B 26/0858 353/11 |
| 9,864,195 | B2* | 1/2018 | Nakamura | G02B 27/0101 |
| 2007/0103747 | A1 | 5/2007 | Powell et al. | |
| 2008/0212194 | A1 | 9/2008 | Powell et al. | |
| 2008/0218822 | A1 | 9/2008 | Powell et al. | |
| 2010/0123880 | A1 | 5/2010 | Oren | |
| 2013/0021224 | A1 | 1/2013 | Fujikawa et al. | |
| 2015/0219803 | A1 | 8/2015 | Inamoto et al. | |
| 2016/0116735 | A1 | 4/2016 | Hayashi et al. | |
| 2016/0266384 | A1 | 9/2016 | Nakamura et al. | |
| 2016/0320615 | A1 | 11/2016 | Nakamura et al. | |
| 2016/0320616 | A1 | 11/2016 | Ichii | |
| 2017/0003506 | A1 | 1/2017 | Miyatake et al. | |

FOREIGN PATENT DOCUMENTS

| | | |
|---|---|---|
| JP | 2009-069399 | 4/2009 |
| JP | 2011-137925 | 7/2011 |
| JP | 2013-025205 | 2/2013 |
| JP | 2013-61554 | 4/2013 |
| JP | 5370427 | 9/2013 |
| JP | 2015-145962 | 8/2015 |
| JP | 2015-232691 | 12/2015 |
| JP | 2015-232692 | 12/2015 |
| JP | 2015-232693 | 12/2015 |
| JP | 2016-75881 A | 5/2016 |
| JP | 2016-110027 A | 6/2016 |
| JP | 2016-136222 A | 7/2016 |
| JP | 2016-170185 A | 9/2016 |
| JP | 2016-206563 A | 12/2016 |
| JP | 2016-206612 A | 12/2016 |
| JP | 2017-003803 A | 1/2017 |
| JP | 2017-016006 A | 1/2017 |
| JP | 2017-021079 A | 1/2017 |
| JP | 2017-032971 A | 2/2017 |

OTHER PUBLICATIONS

Extended European Search Repot dated Jul. 27, 2016 in Patent Application No. 16159466.8.
Office Action dated Jun. 29, 2017 in U.S. Appl. No. 15/066,448.
Office Action dated Nov. 27, 2018, in Japanese Patent Application No. 2015-047887.

* cited by examiner

IMAGE DISPLAY APPARATUS

CROSS-REFERENCE TO RELATED APPLICATION

The present application is a continuation of U.S. application Ser. No. 15/066,448, filed Mar. 10, 2016, now U.S. Pat. No. 9,864,195, and claims priority to and incorporates by reference the entire contents of Japanese Patent Application No. 2015-047887 filed in Japan on Mar. 11, 2015.

BACKGROUND OF THE INVENTION

1. Field of the Invention

The present invention relates to an image display apparatus.

2. Description of the Related Art

An image display apparatus called head-up display to be mounted on a moving body (object), such as an automobile, aircraft, and a ship, has been known. A head-up display is an image display apparatus for displaying various types of information related to operations of the moving body in a manner easily visible to the user. A head-up display includes an optical element called combiner, and projects and displays image light for displaying the information upon the combiner. The image light projected on the combiner presents display related to the information to the user in a manner such that the display can be visually observed as a virtual image farther than the physical position of the combiner (on a far side from the user). A front windshield of an automobile and the like may be used as the combiner. A different transmissive reflection member may be used as the combiner.

To improve the viewability of the information displayed by the head-up display, distortion of the virtual image needs to be reduced. The virtual image is generated from an intermediate image formed by an image forming unit. There is known a head-up display in which a free-form surface lens is arranged in the preceding stage of the image forming unit to correct distortion caused by the image forming unit (for example, see Japanese Patent No. 5370427).

The head-up display is arranged in front of the user (driver) of the moving body. If the moving body is an automobile, the head-up display is accommodated in the dashboard. What is desired of the head-up display is then to satisfy a demand for further miniaturization and improve the viewability of information.

Like the example of Japanese Patent No. 5370427, an optical system including an image forming unit for generating an intermediate image may include a correction optical element for correcting distortion and/or resolution of the intermediate image. This, however, goes against the demand for miniaturization. In addition, the need for the correction optical element results in an increase in cost.

Therefore, there is a need to provide an image display apparatus of which size and cost can be reduced while maintaining viewability (quality) of a virtual image.

SUMMARY OF THE INVENTION

It is an object of the present invention to at least partially solve the problems in the conventional technology.

According to an embodiment, there is provided an image display apparatus that includes a light source device including a light source unit; a scanning optical system including an image forming unit on which an intermediate image is formed by light from the light source unit; and a virtual image optical system configured to guide light of the intermediate image by using a reflecting mirror and a curved transmissive reflection member. The scanning optical system includes an optical scanning unit configured to scan the light from the light source unit in a main scanning direction and a sub-scanning direction of the image forming unit. The image forming unit is a transmissive member curved with a convex surface toward the reflecting mirror.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Head-Up Display

Figure 1:
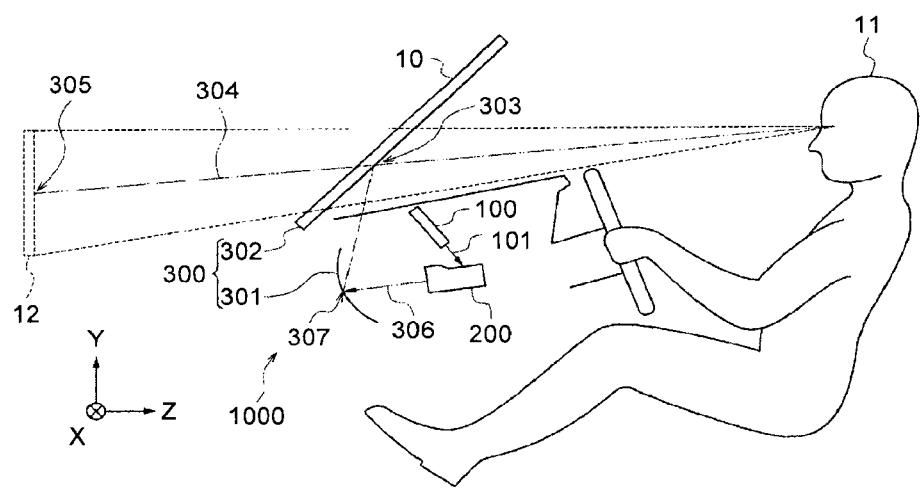
FIG. 1 is a configuration diagram illustrating an example of a head-up display that is an embodiment of an image display apparatus according to the present invention.

A head-up display (hereinafter, referred to as "HUD") which is an embodiment of an image display apparatus according to the present invention will be described below with reference to the drawings. As illustrated in FIG. 1, a HUD 1000 includes a light source device 100, a scanning optical system 200 which is a first optical system, and a virtual image optical system 300 which is a second optical system.

The HUD 1000 is an image display apparatus which is mounted on an object (moving body such as an automobile, aircraft, and a ship) and displays information about an operation and control of the object in an easily visible manner. The following description will be given by using an example where the HUD 1000 is mounted on an automobile.

The HUD 1000 forms an intermediate image including information to be displayed in the scanning optical image 200. The intermediate image is magnified and projected by the virtual image optical system 300 to be visually observable by a user 11 as a magnified virtual image 12. The scanning optical system 200 forms the intermediate image by using light emitted from the light source device 100.

The virtual image optical system 300 according to the present embodiment uses a front windshield 10 of the automobile as a combiner 302. Instead of the front windshield 10, another transmissive reflection member may be used as the combiner 302. In the following description, the target on which the virtual image optical system 300 projects the intermediate image will be referred to as either "combiner 302" or "front windshield 10".

The front windshield 10 of the automobile is tilted in a vertical direction in the field of view of the user 11. The upper side of the front windshield 10 is closer to the user 11. The lower side is farther from the user 11. The front windshield 10 is curved in a horizontal direction in the field of view of the user 11. If the automobile has a right-hand drive configuration, the front windshield 10 is curved to recede from the user from the left side to the middle area of the field of view of the user 11, and approach the user 11 from the middle area to the right side.

If an intermediate image formed by the scanning optical system 200 is projected on the combiner 302, the intermediate image is visible to the user 11 as the magnified virtual image 12 in a position farther from the physical position of the combiner 302. The magnified virtual image 12 displays information about an operating state and the like of the automobile (navigation information such as moving speed, travel distance, and a destination display).

A HUD 1000 of a type that uses the front windshield 10 as the combiner 302 to project the intermediate image on will be referred to as a front windshield projection type. A HUD 1000 of a type that uses a transmissive reflection member other than the front windshield 10 will be referred to as a combiner projection type. There is no difference in displayable information between the two types. A front windshield projection type is preferred in terms of designability of a cabin space inside the automobile, the annoying presence of an object (combiner 302) other than the front windshield 10 in the field of view of the user 11, etc.

In the case of the front windshield projection type, the optical system that generates the intermediate image (scanning optical system 200) is usually embedded in the dashboard of the vehicle. The point of view of the user 11 simply represents a referential viewpoint position (reference eye point). The range of the point of view of the user 11 is equivalent to or narrower than the eye range of drivers for automobiles. The driver eye range is defined in, for example, Japanese Industrial Standards (JIS) D 0021.

A three-dimensional orthogonal coordinate system used in the description of the present embodiment will be described with reference to FIG. 1. In FIG. 1, the direction from the user 11 to the magnified virtual image 12, or equivalently, the direction of the field of view of the user 11 corresponds to the forward traveling direction of the vehicle on which the HUD 1000 is mounted.

As illustrated in FIG. 1, the direction of the field of view of the user 11 will be referred to as a Z-axis direction, the forward direction −Z direction, and the backward direction +Z direction. A horizontal direction in the field of view of the user 11 will be referred to as an X-axis direction. The right-hand direction to the user 11 (direction toward the far side of the plane of FIG. 1) will be referred to as a +X direction, and the left-hand direction (direction toward the near side of the plane of FIG. 1) −X direction. A vertical direction in the field of view of the user 11 will be referred to as a Y-axis direction. The upward direction to the user 11 will be referred to as a +Y direction, and the downward direction −Y direction. In other words, the width direction of the automobile will be referred to as an X-axis direction, the height direction Y-axis direction, and the length direction Z-axis direction.

An overall configuration of the HUD 1000 will be described. As illustrated in FIG. 1, the intermediate image (image light) from a magnifying concave mirror 301 constituting the virtual optical system 300 is incident on the combiner 302. The center of the incident area of the intermediate image will be referred to as an "incident area center 303". As seen in the X-axis direction, a tangential plane at the incident area center 303 tilts with respect to a first virtual axis 304 which connects the point of view of the user 11 and the center of the magnified virtual image 12 (virtual image center 305). As seen in the Y-axis direction, the tangential plane at the incident area center 303 tilts with respect to the first virtual axis 304. The first virtual axis 304 is an axis passing the incident area center 303.

The center of the reflecting surface of the magnifying concave mirror 301 will be referred to as a reflecting surface center 307. The reflecting surface center 307 is the center of an effective reflecting area of the magnifying concave mirror 301 and the center of a light beam that is incident on the virtual optical system 300 from the scanning optical system 200.

Assume that a second virtual axis 306 connects the center of the intermediate image formed by the scanning optical system 200 (the center of a to-be-scanned surface element 202 to be described later) and the reflecting surface center 307. As illustrated in FIG. 1, the second virtual axis 306, when seen in the X-axis direction, tilts with respect to the first virtual axis 304. When seen in the Y-axis direction, the second virtual axis 306 tilts with respect to the first virtual axis 304. A "center of a surface to be scanned" shall refer to the center of an effective scanning area of the to-be-scanned surface element 202 to be described later.

Virtual Image Optical System

A detailed configuration of the virtual optical system 300 will be described. As illustrated in FIG. 1, the virtual image optical system 300 includes the magnifying concave mirror 301 and the combiner 302. The combiner 302 has already been described. A "two-dimensional color image" formed by the to-be-scanned surface element 202 to be described later is delivered to the magnifying concave mirror 301 as an intermediate image. The intermediate image is delivered in the form of light in units of pixels of image information (light corresponding to each pixel). The magnifying concave mirror 301 reflects the intermediate image toward the combiner 302.

Light Source Device

Figure 2:
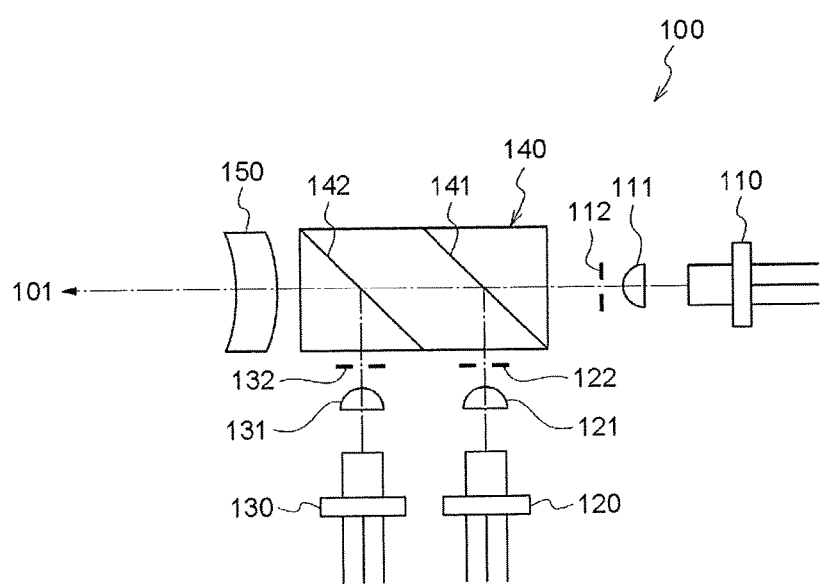
FIG. 2 is a configuration diagram illustrating an example of a light source device included in the head-up display.

Next, components of the HUD 1000 will be described. As illustrated in FIG. 2, the light source device 100 emits an image display beam 101 to be used to form the magnified virtual image 12 which is a color image. The image display beam 101 is a light beam obtained by combining beams in three colors, red (hereinafter, denoted as "R"), green (hereinafter, denoted as "G"), and blue (hereinafter, denoted as "B").

The light source device 100 includes first to third independent light sources 110, 120, and 130. The first light source 110 emits red laser light. The second light source 120 emits green laser light. The third light source 130 emits blue laser light. The first, second, and third light sources 110, 120, and 130 are semiconductor laser devices. Laser diodes (LDs) called edge emitting lasers or vertical cavity surface emitting lasers (VCSELs) may be used. LED devices may be used as the light sources instead of semiconductor laser devices.

The light source device 100 includes a first collimator lens 111, a second collimator lens 121, and a third collimator lens 131 which suppress the divergence of the light emitted from the respective light sources.

The light source device 100 includes a first aperture 112, a second aperture 122, and a third aperture 132 which correspond to the light passed through the respective collimator lenses. The apertures 112, 122, and 132 regulate the light beam diameters of the light to shape the light beams. The light source device 100 further includes a beam combining prism 140 which combines the shaped light beams of the respective colors and emits the image display beam 101, and a condenser lens 150.

The beam combining prism 140 includes a first dichroic film 141 which transmits red light and reflects green light, and a second dichroic film 142 which transmits red light and green light and reflects blue light.

The red light emitted from the first light source 110 is incident on the beam combining prism 140 via the first collimator lens 111 and the first aperture 112. The red light incident on the beam combining prism 140 travels straight through the first dichroic film 141.

The green light emitted from the second light source 120 is incident on the beam combining prism 140 via the second collimator lens 121 and the second aperture 122. The green light incident on the beam combining prism 140 is reflected by the first dichroic film 141 and guided in the same direction as the red light (toward the second dichroic film 142).

The blue light emitted from the third light source 130 is incident on the beam combining prism 140 via the third collimator lens 131 and the third aperture 132. The blue light incident on the beam combining prism 140 is reflected by the second dichroic film 142 in the same direction as the red light and the green light.

As described above, the red light and the green light passed through the second dichroic film 142 and the blue light reflected by the second dichroic film 142 are emitted from the beam combining prism 140 in the same direction. The laser light emitted from the beam combining prism 140 is one laser light beam into which the red light, the green light, and the blue light are combined. The laser light beam is converted into the image display beam 101 by the condenser lens 150.

The condenser lens 150 is an optical element that guides the image display beam 101, which is converging light, to a two-dimensional deflection element 201 (see FIGS. 3A and 3B) serving as an optical scanning unit to be described below. The condenser lens 150 preferably has a focal length f of greater than 150 mm at a wavelength of 587.65 nm (reference wavelength).

The laser light beams of the respective colors R, G, and B constituting the image display beam 101 are modulated in intensity according to a signal or data related to the "two-dimensional color image" to be displayed. The intensity modulation of the laser light beams may be implemented by directly modulating the semiconductor lasers of the respective colors (direct modulation method) or by modulating the laser light beams emitted from the semiconductor lasers of the respective colors (external modulation method).

In other words, the light sources emit the laser light of the respective colors of which emission intensity is modulated according to image signals of the respective color components R, G, and B by driving means driving the light sources.

Scanning Optical System

Figure 12:
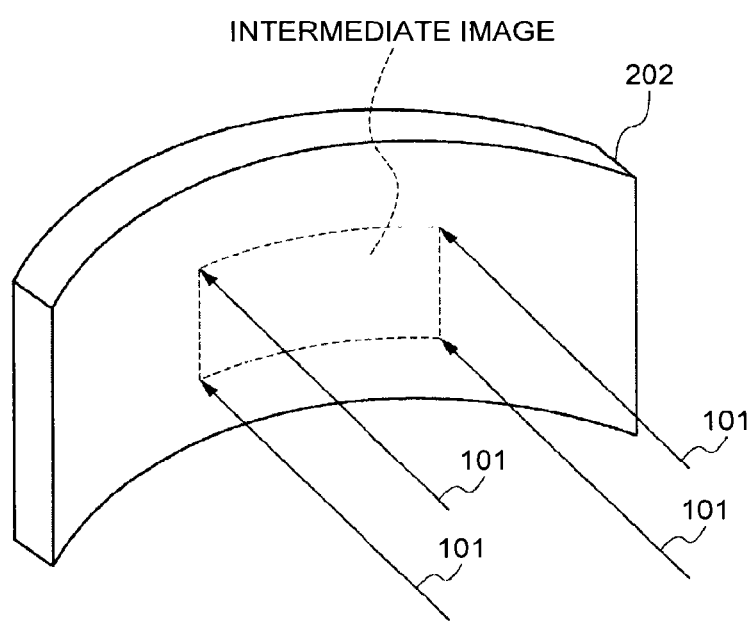
FIG. 12 is a perspective view of the to-be-scanned surface element included in the scanning optical system.

Next, the scanning optical system 200 will be described in detail. The to-be-scanned surface element 202 included in the scanning optical system 200 will initially be described. FIG. 12 is a perspective view of the to-be-scanned surface element 202 as seen obliquely from above the incident direction of the image display beam 101. As illustrated in FIG. 12, with the X direction as a longitudinal direction and the Y direction as a transverse direction, the to-be-scanned surface element 202 has a longitudinally-curved cylindrical shape. A convex portion corresponding to the top of the curved portion of the to-be-scanned surface element 202 is directed in the −Z direction. The to-be-scanned surface element 202 may also be curved in the transverse direction. If the to-be-scanned surface element 202 is also curved in the transverse direction, the convex surface is directed in the −Z direction.

Figure 3A:
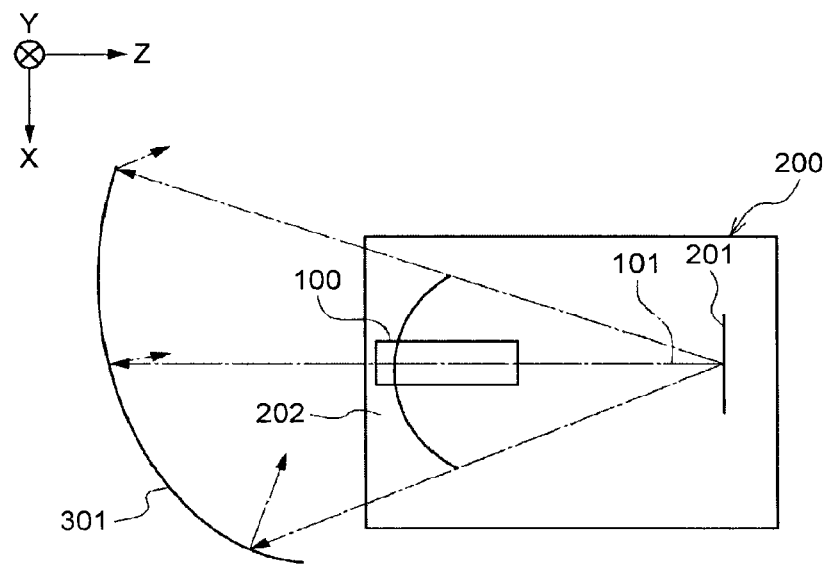
FIG. 3A is a plan view illustrating an example of a scanning optical system included in the head-up display.
Figure 3B:
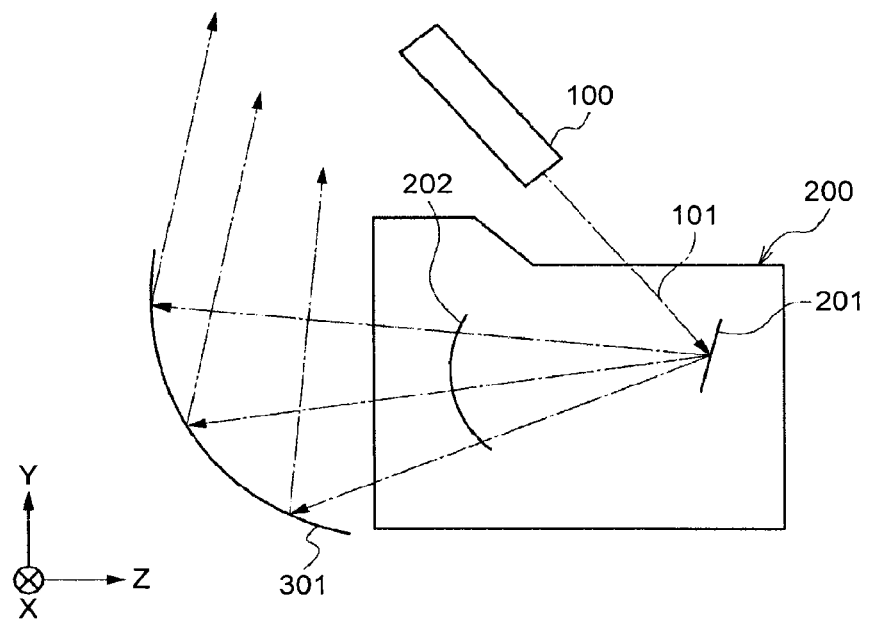
FIG. 3B is a side view illustrating the example of the scanning optical system.

As illustrated in FIGS. 3A and 3B, the scanning optical system 200 including the to-be-scanned surface element 202 described above includes the two-dimensional deflection element 201 serving as optical scanning means, and the to-be-scanned surface element 202 serving as an image forming unit.

FIG. 3A is an optical layout diagram illustrating the scanning optical system 200 on the XZ plane as seen in the +Y direction from the −Y side. In other words, FIG. 3A is a plan view of the scanning optical system 200 as seen from below.

FIG. 3B is an optical layout diagram illustrating the scanning optical system 200 on the YZ plane as seen in the +X direction from the −X side. In other words, FIG. 3B is a side view of the scanning optical system 200 as seen from the left.

As illustrated in FIG. 3A, the to-be-scanned surface element 202 is curved with the convex surface toward the magnifying convex mirror 301 at least on the XZ plane. As has been described, the X direction is the longitudinal direction of the to-be-scanned surface element 202. This longitudinal direction coincides with that of the magnified virtual image 12.

As illustrated in FIG. 3B, the to-be-scanned surface element 202 may be curved with the convex surface toward the magnifying concave mirror 301 on the YZ plane. As has been described, the Y direction is the transverse direction of the to-be-scanned surface element 202. This transverse direction coincides with that of the magnified virtual image 12.

The to-be-scanned surface element 202 is a transmissive member which shows the intermediate image to the side of the magnifying concave mirror 301 when optically scanned by the two-dimensional deflection element 201.

As illustrated in FIGS. 3A and 3B, the scanning optical system 200 does not include a condenser element for giving the image display beam 101 a condensing effect or diverging effect between the two-dimensional deflection element 201 and the to-be-scanned surface element 202. The HUD 1000 thus allows a cost reduction while improving robustness.

The two-dimensional deflection element 201 serving as the optical scanning unit is an element that two-dimensionally deflects the image display beam 101 emitted from the light source device 100. The two-dimensional deflection element 201 is an assembly of micromirrors configured to rock by using two mutually orthogonal shafts. The two-dimensional deflection element 201 is a microelectromechanical system (MEMS) produced as a micro rocking mirror element by semiconductor processes etc. The structure of the MEMS used as the two-dimensional deflection element 201 is not limited to this example. For example, two micromirrors may be arranged on one shaft and the two micromirrors may be configured to rock about the one shaft in mutually orthogonal directions.

The image display beam 101 is incident on the to-be-scanned surface element 202 according to a deflection operation of the two-dimensional deflection element 201. The to-be-scanned surface element 202 is two-dimensionally scanned by the image display beam 101 in a main scanning direction and a sub-scanning direction. More specifically, for example, raster scan is performed so that the to-be-scanned surface 202 is scanned at high speed in the main scanning direction and scanned at low speed in the sub-scanning direction. The two-dimensional scanning of the to-be-scanned surface element 202 forms an intermediate image. The intermediate image formed here is a "two-dimensional color image". While the present embodiment is described by assuming a color image, a monochrome image may be formed on the to-be-scanned surface element 202.

What is displayed on the to-be-scanned surface element 202 at each moment is "only a pixel that is irradiated with the image display beam 101 at that moment". The "two-dimensional color image" is thus formed as a "set of pixels displayed at respective moments", resulting from the two-dimensional scanning of the image display beam 101.

The to-be-scanned surface element 202 includes small convex lenses. The intermediate image formed on the to-be-scanned surface element 202 by the image display beam 101 appears on the side of the virtual image optical system 300 as magnified by the small convex lens structure. This magnified intermediate image is reflected by the magnifying convex mirror 301 and projected on the combiner 302. The combiner 302 reflects the projected image toward the user 11. This image is focused on the retinas of the user 11 and visually observed as the magnified virtual image 12. With such a configuration, the user 11 can visually observe the magnified virtual image 12 with reliability even if the user 11 makes some head movement (moves the point of view).

The to-be-scanned surface element 202 is not limited to the small convex lens structure (microlens array). A diffusion plate, a translucent screen, a reflection screen, or the like may be used. In the present embodiment, the to-be-scanned surface element 202 which is a microlens array is assumed to include a plurality of two-dimensionally arranged microlenses. Instead, a plurality of one-dimensionally arranged microlenses or three-dimensionally arranged microlenses may be used.

Example 1

Next, an embodiment of the scanning optical system 200 will be described. Table 1 below lists an example of specifications of the HUD 1000 according to Example 1 and dimensions of the to-be-scanned surface element 202 serving as the image forming unit.

TABLE 1

| | |
|---|---|
| VIRTUAL IMAGE POSITION (DISTANCE FROM OBSERVER 11 TO MAGNIFIED VIRTUAL IMAGE 12) | 6 m |
| ANGLE OF VIEW (ANGLE AT WHICH OBSERVER 11 VIEWS MAGNIFIED VIRTUAL IMAGE 12) | 7° × 3° |
| SIZE OF IMAGE FORMING UNIT (TO-BE-SCANNED SURFACE ELEMENT 202) | 33 mm × 16 mm |

Table 2 below lists an example of the specifications of the two-dimensional deflection element 201 (MEMS) which is the optical scanning unit. The tilt angle is of the micromirrors included in the two-dimensional deflection element 201.

TABLE 2

| | MAIN SCANNING DIRECTION | SUB-SCANNING DIRECTION |
|---|---|---|
| TILT ANGLE (°) | 16.7 | 9.3 |
| EFFECTIVE SIZE (mm) | 0.75 | 0.98 |

Table 3 below lists an example of data related to optical elements included in the light source device 100 and the scanning optical system 200. "Surface number" in Table 3 is assigned with the light emitting points of the first, second, and third light sources 110, 120, and 130 included in the light source device 100 as the "zeroth surface". The light incident side of the to-be-scanned surface element 202 is the ninth surface. The first to eighth surfaces refer to surfaces that give an optically effect to the light emitted from the light source units. Examples of the optical effect include convergence and divergence.

TABLE 3

| SURFACE NUMBER | Y RADIUS OF CURVATURE Ry (mm) | X RADIUS OF CURVATURE Rx (mm) | SURFACE DISTANCE (mm) | MATERIAL | REMARKS |
|---|---|---|---|---|---|
| 0 | 1.00E+18 | 1.00E+18 | 2.46 | | LIGHT EMITTING POINTS OF 1ST, 2ND, AND 3RD LIGHT SOURCE UNITS 110, 120, AND 130 |
| 1 | 1.00E+18 | 1.00E+18 | 0.25 | SBSL7 | |
| 2 | 1.00E+18 | 1.00E+18 | 5.26 | | |
| 3 | 1.00E+18 | 1.00E+18 | 5.00 | DZK3 | 1ST COLLIMATOR LENS 111 |
| 4 | −6.428 | −6.428 | 0.20 | | 2ND COLLIMATOR LENS 121 3RD COLLIMATOR LENS 131 |
| 5 | 1.00E+18 | 1.00E+18 | 27.83 | | 1ST APERTURE 112 2ND APERTURE 122 3RD APERTURE 132 |
| 6 | 4.200 | 4.200 | 3.00 | LLAM60 | CONDENSER LENS 150 |
| 7 | 3.010 | 3.010 | 56.00 | | |
| 8 | 1.00E+18 | 1.00E+18 | −72.03 | | TWO-DIMENSIONAL DEFLECTION ELEMENT 201 |
| 9 | 1.00E+18 | 44.8 | 0.00 | | TO-BE-SCANNED SURFACE ELEMENT 202 |

The fifth surface listed in Table 3 corresponds to the aperture surfaces of the respective first, second, and third apertures 112, 122, and 132. The opening areas of the apertures are defined by the sizes of the aperture surfaces in the main scanning direction and the sub-scanning direction. The apertures have opening areas of different sizes.

The aperture surface of the first aperture 112 corresponding to the red light source has a size of 2.08 mm in the main scanning direction and 3.04 mm in the sub-scanning direction. The aperture surfaces of the second aperture 122 corresponding to the green light source and the third aperture 132 corresponding to the blue light source both have a size of 2.0 mm in the main scanning direction and 2.4 mm in the sub-scanning direction. That is, the first aperture 112 corresponding to the first light source unit which is the red light source has an opening area greater than that of both the second and third apertures 122 and 132. This can increase the input efficiency of light from the red light source.

As listed in Table 3, the to-be-scanned surface element 202 has a Y radius of curvature Ry (1.00E+18) and an X radius of curvature Rx (44.8) which have a relationship of $|Rx|<|Ry|$. The Y radius of curvature Ry of the to-be-scanned surface element 202 refers to the radius of curvature at the center of the to-be-scanned surface element 202 in the transverse direction (Y direction). The X radius of curvature Rx of the to-be-scanned surface element 202 refers to the radius of curvature at the center of the to-be-scanned surface element 202 in the longitudinal direction (X direction).

The radius of curvature at the center of the to-be-scanned surface element 202 in the transverse direction (Y radius of curvature Ry) is 1.00E+18, which means a substantially flat surface. The radius of curvature at the center of the to-be-scanned surface element 202 in the longitudinal direction (X radius of curvature Rx) is 44.8. The to-be-scanned surface element 202 thus has a longitudinally-curved cylindrical shape.

As listed in Table 3, the condenser lens 150 is an optical element that guides converging light to the two-dimensional deflection element 201 which is the optical scanning unit. The condenser lens 150 has a focal length f of greater than 150 mm with respect to light having a wavelength of 587.56 nm. This can reduce the beam spot diameter on the to-be-scanned surface element 202 to form an intermediate image having high resolution.

Figure 4A:
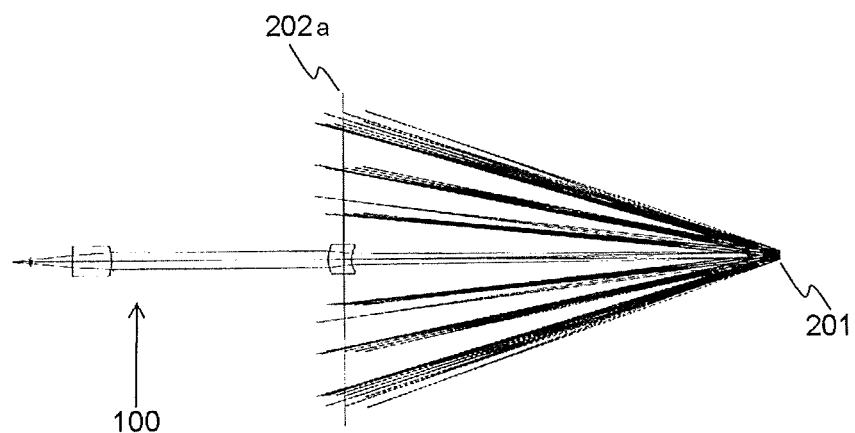
FIG. 4A is an optical path diagram in a direction of a main scanning section in Example 1 of the scanning optical system including a flat to-be-scanned surface element.
Figure 4B:
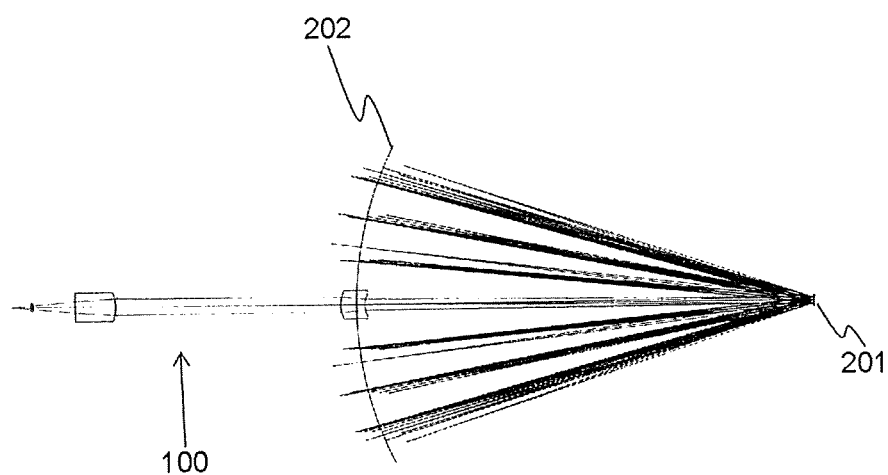
FIG. 4B is an optical path diagram in a direction of a main scanning section in Example 1 of the scanning optical system including a curved to-be-scanned surface element.

Next, optical performance of the HUD 1000 including the scanning optical system 200 according to Example 1 will be described. FIGS. 4A and 4B illustrate examples of an optical path diagram of the to-be-scanned surface element 202 in the direction of a main scanning section. In the following description of Example 1, the optical performance of the HUD 1000 will be described by using a case where the to-be-scanned surface element 202 is assumed to have a flat shape as illustrated in FIG. 4A as a comparative example. The following specifications related to the optical performance were calculated by calculator simulation.

FIG. 4A is an optical path diagram of the comparative example in which the to-be-scanned surface element 202 is assumed to be flat in the longitudinal direction. FIG. 4B is an optical path diagram of the to-be-scanned surface element 202 that has the curved shape in the main scanning direction as has been described.

Next, a correlation between an arrival position of the image display beam 101 on the to-be-scanned surface element 202 according to Example 1 and the size of the beam spot diameter will be described with reference to FIGS. 5A and 5B. The horizontal axes of the graphs of FIGS. 5A and 5B indicate the arrival position of light on the to-be-scanned surface element 202 when the micromirrors of the two-dimensional deflection element 202 are set to the angles in the main scanning direction and the sub-scanning direction corresponding to "number" in the following Table 4. The angles in Table 4 indicate those of the micromirrors with respect to the optical axis of the scanning optical system 200. The vertical axes of the graphs of FIGS. 5A and 5B indicate the size of the beam spot diameter.

Figure 5A:
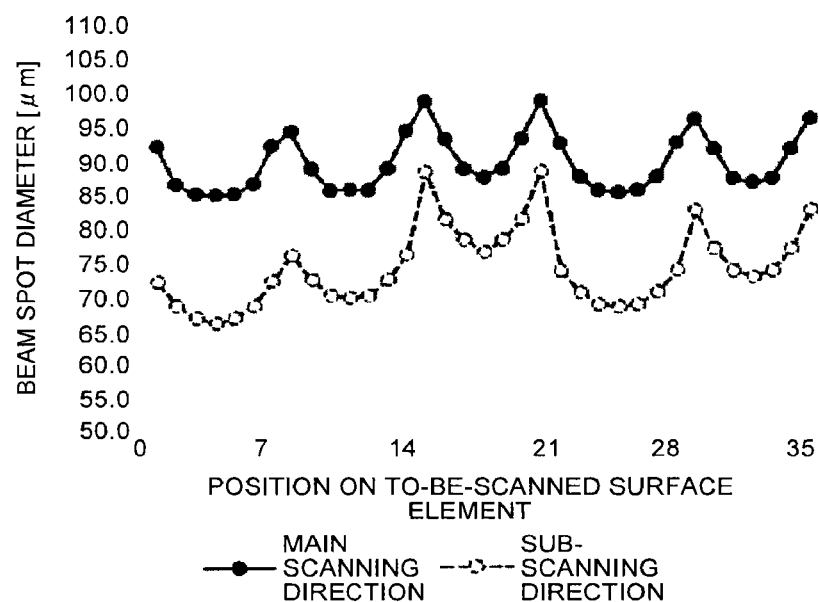
FIG. 5A is a graph illustrating an example of a correlation between a position and a beam spot diameter on the flat to-be-scanned surface element in Example 1 of the scanning optical system.
Figure 5B:
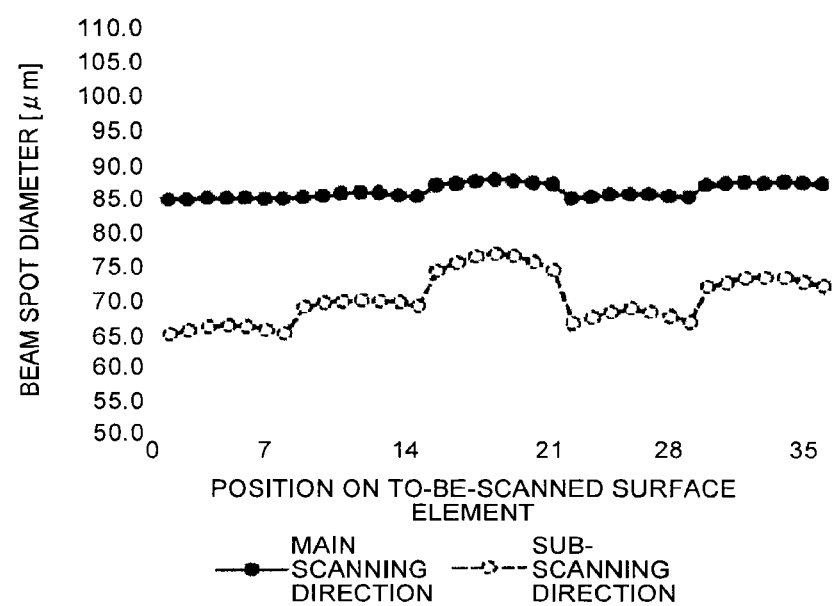
FIG. 5B is a graph illustrating an example of a correlation between a position and a beam spot diameter on the curved to-be-scanned surface element in Example 1 of the scanning optical system.

FIG. 5A illustrates the graph of the comparative example where the to-be-scanned surface element 202 is assumed to be flat. FIG. 5B illustrates the graph of the to-be-scanned surface element 202. As is clear from a comparison between the graphs of FIGS. 5A and 5B, if the to-be-scanned surface element 202 has a longitudinally curved shape, the size of the beam spot diameter at each position on the to-be-scanned surface element 202 varies less than when the to-be-scanned surface element 202 is a flat one.

TABLE 4

| NUMBER | MAIN SCANNING DIRECTION (°) | SUB-SCANNING DIRECTION (°) |
| --- | --- | --- |
| 1 | −10.2 | 7.8 |
| 2 | −10.2 | 5.3 |
| 3 | −10.2 | 2.7 |
| 4 | −10.2 | 0.0 |
| 5 | −10.2 | −2.7 |
| 6 | −10.2 | −5.3 |
| 7 | −10.2 | −7.8 |
| 8 | −13.7 | 7.8 |
| 9 | −13.7 | 5.3 |
| 10 | −13.7 | 2.7 |
| 11 | −13.7 | 0.0 |
| 12 | −13.7 | −2.7 |
| 13 | −13.7 | −5.3 |
| 14 | −13.7 | −7.8 |
| 15 | −17.2 | 7.8 |
| 16 | −17.2 | 5.3 |
| 17 | −17.2 | 2.7 |
| 18 | −17.2 | 0.0 |
| 19 | −17.2 | −2.7 |
| 20 | −17.2 | −5.3 |
| 21 | −17.2 | −7.8 |
| 22 | −11.8 | 7.8 |
| 23 | −11.8 | 5.3 |
| 24 | −11.8 | 2.7 |
| 25 | −11.8 | 0.0 |
| 26 | −11.8 | −2.7 |
| 27 | −11.8 | −5.3 |
| 28 | −11.8 | −7.8 |
| 29 | −15.6 | 7.8 |
| 30 | −15.6 | 5.3 |
| 31 | −15.6 | 2.7 |
| 32 | −15.6 | 0.0 |
| 33 | −15.6 | −2.7 |
| 34 | −15.6 | −5.3 |
| 35 | −15.6 | −7.8 |

Next, variations of the beam spot diameter in each arrival position of the image display beam 101 when the to-be-scanned surface element 202 is moved in a normal direction (Z-axis direction, i.e., front-to-back direction) will be described with reference to FIGS. 6A to 6D. The horizontal axes of the graphs of FIGS. 6A to 6D indicate the amount of movement with the position of the to-be-scanned surface element 202 defined by the specifications listed in Table 3 as an origin. The vertical axes indicate the size of the diameter of the beam spot formed on the to-be-scanned surface element 202.

Figure 6A:
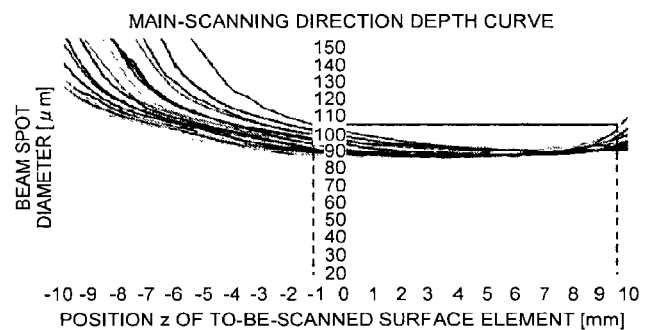
FIG. 6A is a graph illustrating an example of a correlation in the main scanning direction between the beam spot diameter and an arrival position of light on the flat to-be-scanned surface element when moved in Example 1.
Figure 6B:
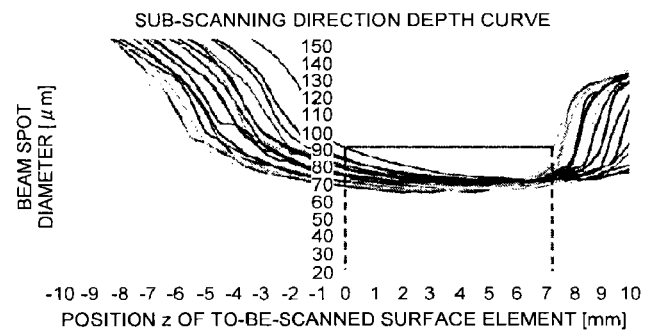
FIG. 6B is a graph illustrating an example of a correlation in the sub-scanning direction between the beam spot diameter and an arrival position of light on the flat to-be-scanned surface element when moved in Example 1.
Figure 6C:
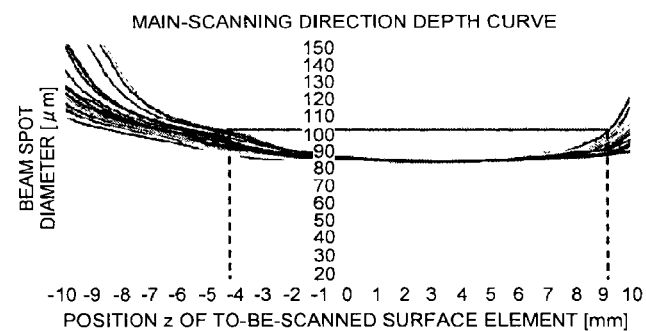
FIG. 6C is a graph illustrating an example of a correlation in the main scanning direction between the beam spot diameter and an arrival position of light on the curved to-be-scanned surface element when moved in Example 1.
Figure 6D:
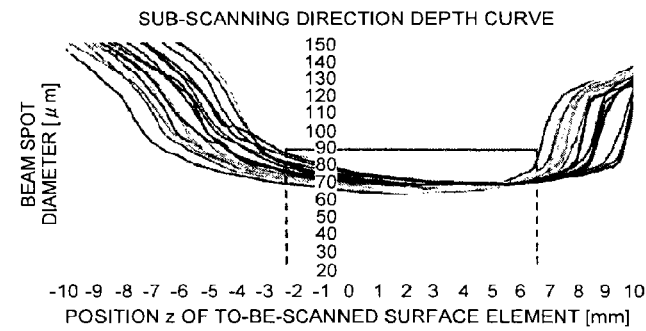
FIG. 6D is a graph illustrating an example of a correlation in the sub-scanning direction between the beam spot diameter and an arrival position of light on the curved to-be-scanned surface element when moved in Example 1.

FIG. 6A illustrates as a comparative example a correlation between the arrival position of the image display beam 101 and the size of the beam spot diameter in the main scanning direction when the flat to-be-scanned surface element 202 is moved in the Z-axis direction. FIG. 6B similarly illustrates as a comparative example a correlation between the arrival position of the image display beam 101 and the size of the beam spot diameter in the sub-scanning direction when the flat to-be-scanned surface element 202 is moved in the Z-axis direction. FIG. 6C illustrates a correlation between the arrival position of the image display beam 101 and the size of the beam spot diameter in the main scanning direction when the longitudinally-curved to-be-scanned surface element 202 is moved in the Z-axis direction. FIG. 6D illustrates a correlation between the arrival position of the image display beam 101 and the size of the beam spot diameter in the sub-scanning direction when the longitudinally-curved to-be-scanned surface element 202 is moved in the Z-axis direction.

The value at the intersection of the solid line illustrated in each of FIGS. 6A to 6D and the vertical axis of the graph is a target value of the beam spot diameter in Example 1. In the to-be-scanned surface element 202 according to Example 1, the beam spot diameter has a target value of 103 μm in the main scanning direction and a target value of 89 μm in the sub-scanning direction.

The values at the intersections of two respective broken lines parallel to the vertical axis illustrated in each of FIGS. 6A to 6D and the horizontal axis of the graph indicate the amounts of movement from the origin. A difference in the amount of movement between the two parallel broken lines indicates an allowable amount of movement of the to-be-scanned surface element 202 in the front-to-back direction, the allowable amount of movement being allowed to satisfy the target value of the beam spot diameter. As illustrated in FIGS. 6A and 6B, if the to-be-scanned surface element 202 is a flat one, the allowable amount of movement in the main scanning direction is approximately 10.8 mm. By contrast, as illustrated in FIGS. 6C and 6D, the curved to-be-scanned surface element 202 according to the present embodiment has an allowable amount of movement of approximately 13 mm.

Therefore, if the to-be-scanned surface element 202 has the curved shape curved in the main scanning direction (longitudinal direction), the allowable amount of movement of the to-be-scanned surface element 202 in the front-to-back direction with which the beam spot diameter in the main scanning direction has a satisfactory size can be increased.

The allowable amounts of movement of the to-be-scanned surface element 202 in the sub-scanning direction are similarly compared. If the to-be-scanned surface element 202 is a flat one, the allowable amount of movement is approximately 7.2 mm. If the to-be-scanned surface element 202 has the curved shape in the main scanning direction, the allowable amount of movement is approximately 8.5 mm. That is, the to-be-scanned surface element 202 according to the present embodiment can increase the allowable amount of movement in the sub-scanning direction as well.

As described above, the to-be-scanned surface element 202 according to the present embodiment has the curved shape in the main scanning direction. This can increase the allowable value for the displacement of the to-be-scanned surface element 202 when the scanning optical system 200 is assembled. As a result, the robustness increases.

Figure 7A:
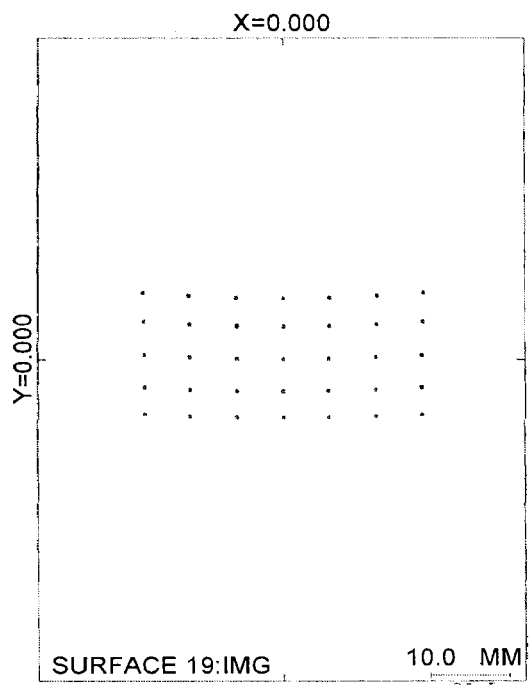
FIG. 7A is a diagram illustrating arrival positions of light on the flat to-be-scanned surface element in Example 1.
Figure 7B:
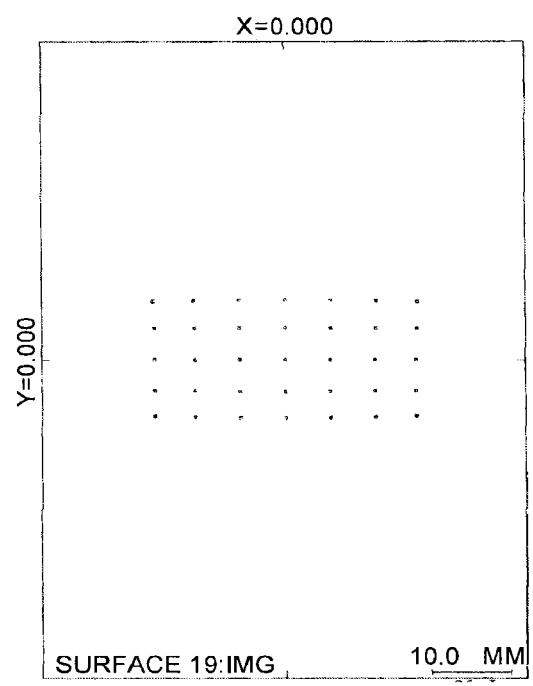
FIG. 7B is a diagram illustrating arrival positions of light on the curved to-be-scanned surface element in Example 1.

Next, the arrival points of light on the to-be-scanned surface element 202 (arrival points of the image display beam 101) will be described by comparison like the foregoing. FIGS. 7A and 7B illustrate the arrival points of light on the to-be-scanned surface element 202 according to combinations of the angles of the micromirrors listed in Table 4. In other words, FIGS. 7A and 7B illustrate a configuration of image formation on the to-be-scanned surface element 202.

FIG. 7A illustrates an example where the to-be-scanned surface 202 has a flat shape. FIG. 7B illustrates an example where the to-be-scanned surface 202 is longitudinally curved. It is shown that if the to-be-scanned surface element 202 has the shape of the curved surface curved in the longitudinal direction (main scanning direction), the distortion of the image (intermediate image) can be made smaller than with a flat surface. Since the image distortion of the magnified virtual image 12 displayed by the virtual image optical system 300 arranged in the subsequent stage of the scanning optical system 200 can be reduced as well, a magnified virtual image 12 of high image quality can be displayed.

Example 2

Next, another embodiment of the scanning optical system 200 will be described. Table 5 below lists an example of the specifications of the HUD 1000 according to Example 2 and the dimensions of the to-be-scanned surface element 202 which is the image forming unit.

TABLE 5

| | |
|---|---|
| VIRTUAL IMAGE POSITION (DISTANCE FROM OBSERVER 11 TO MAGNIFIED VIRTUAL IMAGE 12) | 2 m |
| ANGLE OF VIEW (ANGLE AT WHICH OBSERVER 11 VIEWS MAGNIFIED VIRTUAL IMAGE 12) | 6° × 2.5° |
| SIZE OF IMAGE FORMING UNIT (TO-BE-SCANNED SURFACE ELEMENT 202) | 30 mm × 14.3 mm |

Table 6 below lists an example of the specifications of the two-dimensional deflection element 201 (MEMS) which is the optical scanning unit. The tilt angle is of the micromirrors included in the two-dimensional deflection element 201.

TABLE 6

| | MAIN SCANNING DIRECTION | SUB-SCANNING DIRECTION |
|---|---|---|
| TILT ANGLE (°) | 16.7 | 9.3 |
| EFFECTIVE SIZE (mm) | 0.75 | 0.98 |

Table 7 below lists another example of the data related to the optical elements included in the light source device 100 and the scanning optical system 200. "Surface number" in Table 7 is assigned with the light emitting points of the first, second, and third light sources 110, 120, and 130 included in the light source device 100 as the "zeroth surface". The light incident side of the to-be-scanned surface element 202 is the ninth surface. The first to eighth surfaces refer to surfaces that give an optical effect to the light emitted from the light source units. Examples of the optical effect include convergence and divergence.

TABLE 7

| SURFACE NUMBER | Y RADIUS OF CURVATURE Ry (mm) | X RADIUS OF CURVATURE Rx (mm) | SURFACE DISTANCE (mm) | MATERIAL | REMARKS |
|---|---|---|---|---|---|
| 0 | 1.00E+18 | 1.00E+18 | 2.46 | | LIGHT EMITTING POINTS OF 1ST, 2ND, AND 3RD LIGHT SOURCE UNITS 110, 120, AND 130 |
| 1 | 1.00E+18 | 1.00E+18 | 0.25 | SBSL7 | |
| 2 | 1.00E+18 | 1.00E+18 | 5.26 | | |
| 3 | 1.00E+18 | 1.00E+18 | 5.00 | SBSL7 | 1ST COLLIMATOR LENS 111 2ND COLLIMATOR LENS 121 3RD COLLIMATOR LENS 131 |
| 4 | −6.428 | −6.428 | 0.20 | | |
| 5 | 1.00E+18 | 1.00E+18 | 30.04 | | 1ST APERTURE 112 2ND APERTURE 122 3RD APERTURE 132 |
| 6 | 4.209 | 4.209 | 3.00 | LLAM60 | CONDENSER LENS 150 |
| 7 | 3.026 | 3.026 | 53.79 | | |
| 8 | 1.00E+18 | 1.00E+18 | −59.57 | | TWO-DIMENSIONAL DEFLECTION ELEMENT 201 |
| 9 | 1.00E+18 | 58.821 | 0.00 | | TO-BE-SCANNED SURFACE ELEMENT 202 |

The fifth surface listed in Table 7 corresponds to the aperture surfaces of the respective first, second, and third apertures 112, 122, and 132. The opening areas of the apertures are defined by the sizes of the aperture surfaces in the main scanning direction and the sub-scanning direction. The apertures have opening areas of different sizes.

The aperture surface of the first aperture 112 corresponding to the red light source has a size of 2.08 mm in the main scanning direction and 3.04 mm in the sub-scanning direction. The aperture surfaces of the second aperture 122 corresponding to the green light source and the third aperture 123 corresponding to the blue light source both have a size of 2.0 mm in the main scanning direction and 2.4 mm in the sub-scanning direction. That is, the first aperture 112 corresponding to the first light source unit which is the red light source has an opening area greater than that of both the second and third apertures 122 and 132. This can increase the input efficiency of light from the red light source.

As listed in Table 7, the to-be-scanned surface element 202 has a Y radius of curvature Ry (1.00E+18) and an X radius of curvature Rx (58.821) which have a relationship of |Rx|<|Ry|. The Y radius of curvature Ry of the to-be-scanned surface element 22 refers to the radius of curvature at the center of the to-be-scanned surface element 202 in the transverse direction (Y direction). The X radius of curvature Rx of the to-be-scanned surface element 202 refers to the radius of curvature at the center of the to-be-scanned surface element 202 in the longitudinal direction (X direction).

The radius of curvature at the center of the to-be-scanned surface element 202 in the transverse direction (Y radius of curvature Ry) is 1.00E+18, which means a substantially flat surface. The radius of curvature at the center of the to-be-scanned surface element 202 in the longitudinal direction (X radius of curvature Rx) is 58.821. The to-be-scanned surface element 202 thus has a longitudinally-curved cylindrical shape.

As listed in Table 7, the condenser lens 150 is an optical element that guides converging light to the two-dimensional deflection element 201 which is the optical scanning unit. The condenser lens 150 has a focal length f of greater than 150 mm with respect to light having a wavelength of 587.56 nm. This can reduce the beam spot diameter on the to-be-scanned surface element 202 to form an intermediate image having high resolution.

Figure 8A:
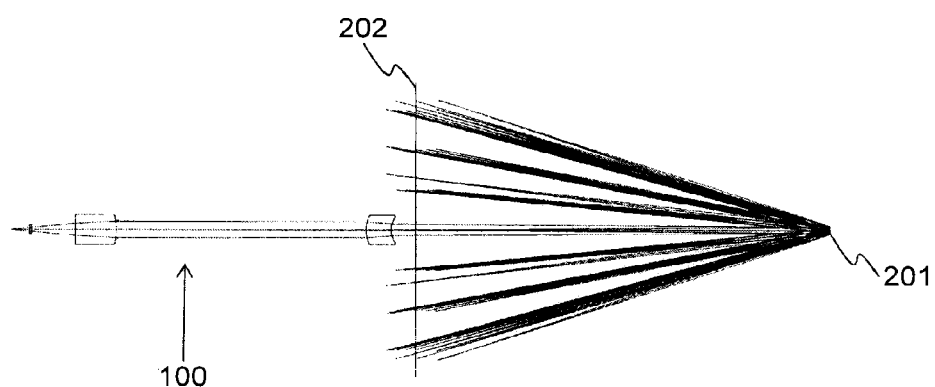
FIG. 8A is an optical path diagram in a direction of a main scanning section in Example 2 of the scanning optical system including a flat to-be-scanned surface element.

Next, the optical performance of the HUD 1000 including the scanning optical system 200 according to Example 2 will be described. FIG. 8A illustrates an example of an optical path diagram of the to-be-scanned surface element 202 in the direction of a main scanning section. In the following description of Example 2, the optical performance of the HUD 1000 will be described by using a case where the to-be-scanned surface element 202 is assumed to have a flat shape as illustrated in FIG. 8A as a comparative example. The following specifications related to the optical performance were calculated by calculator simulation.

Figure 8B:
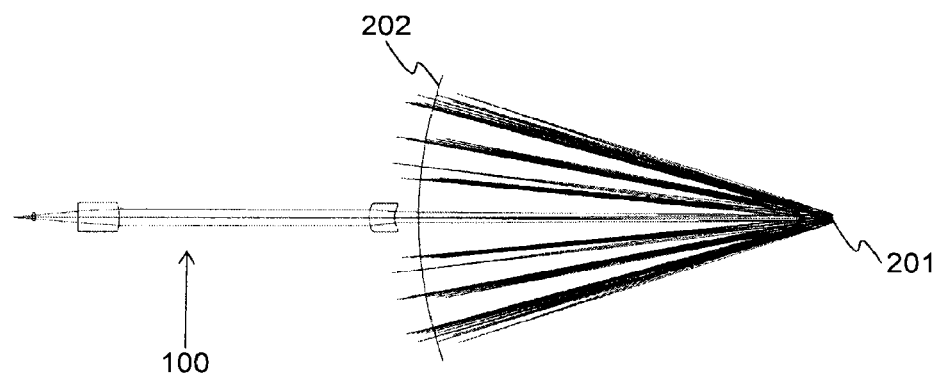
FIG. 8B is an optical path diagram in a direction of a main scanning section in Example 2 of the scanning optical system including a curved to-be-scanned surface element.

FIG. 8A is an optical path diagram of the comparative example in which the to-be-scanned surface element 202 is assumed to have a flat shape. FIG. 8B is an optical path diagram of the to-be-scanned surface element 202 according to Example 2.

Next, a correlation between an arrival position of the image display beam 101 on the to-be-scanned surface element 202 according to Example 2 and the size of the beam spot diameter will be described with reference to FIGS. 9A and 9B. The horizontal axes of the graphs of FIGS. 9A and 9B indicate the arrival position of light on the to-be-scanned surface element 202 when the micromirrors of the two-dimensional deflection element 202 are set to the angles in the main scanning direction and the sub-scanning direction corresponding to "number" in the following Table 8. The angles of Table 8 indicate those of the micromirrors with respect to the optical axis of the scanning optical system 200. The vertical axes of the graphs of FIGS. 9A and 9B indicate the size of the beam spot diameter.

Figure 9A:
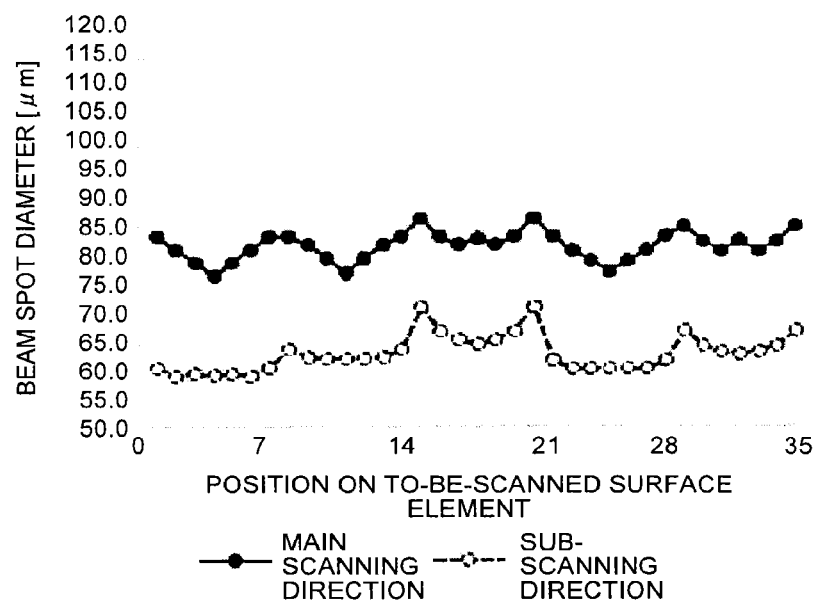
FIG. 9A is a graph illustrating an example of a correlation between a position and a beam spot diameter on the flat to-be-scanned surface element in Example 2 of the scanning optical system.
Figure 9B:
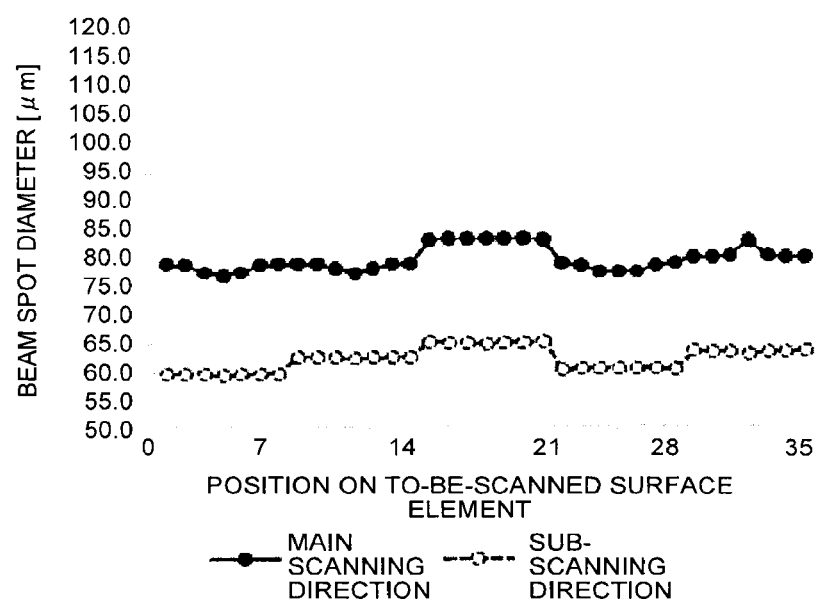
FIG. 9B is a graph illustrating an example of a correlation between a position and a beam spot diameter on the curved to-be-scanned surface element in Example 2 of the scanning optical system.

FIG. 9A illustrates the graph of the comparative example where the to-be-scanned surface element 202 is assumed to be flat. FIG. 9B illustrates the graph of the to-be-scanned surface element 202. As is clear from a comparison between the graphs of FIGS. 9A and 9B, if the to-be-scanned surface element 202 has the longitudinally curved shape, the size of the beam spot diameter at each position on the to-be-scanned surface element 202 varies less than when the to-be-scanned surface element 202 is a flat one.

TABLE 8

| NUMBER | MAIN SCANNING DIRECTION (°) | SUB-SCANNING DIRECTION (°) |
|---|---|---|
| 1 | 7.8 | −10.2 |
| 2 | 5.3 | −10.2 |
| 3 | 2.7 | −10.2 |
| 4 | 0.0 | −10.2 |
| 5 | −2.7 | −10.2 |
| 6 | −5.3 | −10.2 |
| 7 | −7.8 | −10.2 |
| 8 | 7.8 | −13.7 |
| 9 | 5.3 | −13.7 |
| 10 | 2.7 | −13.7 |
| 11 | 0.0 | −13.7 |
| 12 | −2.7 | −13.7 |
| 13 | −5.3 | −13.7 |
| 14 | −7.8 | −13.7 |
| 15 | 7.8 | −17.2 |
| 16 | 5.3 | −17.2 |
| 17 | 2.7 | −17.2 |
| 18 | 0.0 | −17.2 |
| 19 | −2.7 | −17.2 |
| 20 | −5.3 | −17.2 |
| 21 | −7.8 | −17.2 |
| 22 | 7.8 | −11.8 |
| 23 | 5.3 | −11.8 |
| 24 | 2.7 | −11.8 |
| 25 | 0.0 | −11.8 |
| 26 | −2.7 | −11.8 |
| 27 | −5.3 | −11.8 |
| 28 | −7.8 | −11.8 |
| 29 | 7.8 | −15.6 |
| 30 | 5.3 | −15.6 |
| 31 | 2.7 | −15.6 |
| 32 | 0.0 | −15.6 |
| 33 | −2.7 | −15.6 |
| 34 | −5.3 | −15.6 |
| 35 | −7.8 | −15.6 |

Next, variations of the beam spot diameter in each arrival position of the image display beam 101 when the to-be-scanned surface element 202 is moved in the normal direction (Z-axis direction, i.e., front-to-back direction) will be described with reference to FIGS. 10A to 10D. The horizontal axes of the graphs of FIGS. 10A to 10D indicate the amount of movement with the position of the to-be-scanned surface element 202 defined by the specifications listed in Table 7 as an origin. The vertical axes indicate the size of the diameter of the beam spot formed on the to-be-scanned surface element 202.

Figure 10A:
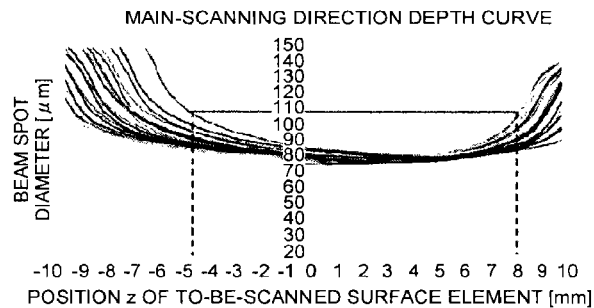
FIG. 10A is a graph illustrating an example of a correlation in the main scanning direction between the beam spot diameter and an arrival position of light on the flat to-be-scanned surface element when moved in Example 2.
Figure 10B:
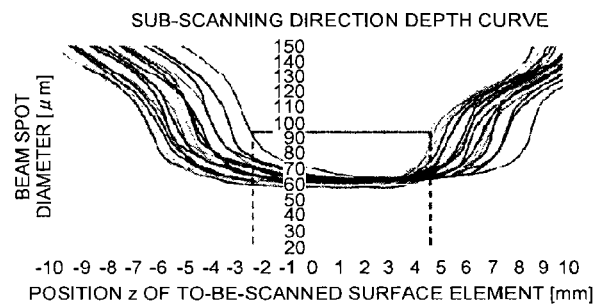
FIG. 10B is a graph illustrating an example of a correlation in the sub-scanning direction between the beam spot diameter and an arrival position of light on the flat to-be-scanned surface element when moved in Example 2.
Figure 10C:
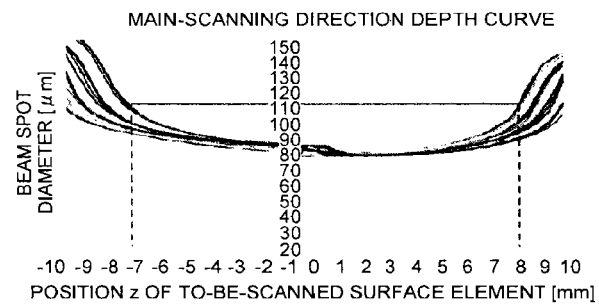
FIG. 10C is a graph illustrating an example of a correlation in the main scanning direction between the beam spot diameter and an arrival position of light on the curved to-be-scanned surface element when moved in Example 2.
Figure 10D:
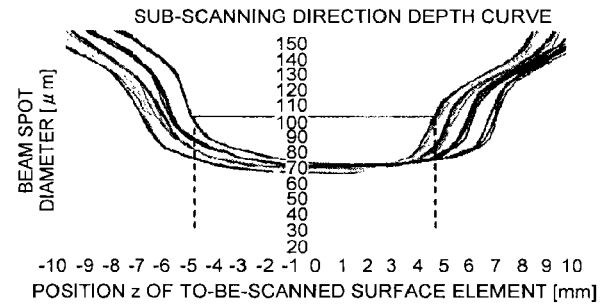
FIG. 10D is a graph illustrating an example of a correlation in the sub-scanning direction between the beam spot diameter and an arrival position of light on the curved to-be-scanned surface element when moved in Example 2.

FIG. 10A illustrates as a comparative example a correlation between the arrival position of the image display beam 101 and the size of the beam spot diameter in the main scanning direction when the flat to-be-scanned surface element 202 is moved in the Z-axis direction. FIG. 10B similarly illustrates as a comparative example a correlation between the arrival position of the image display beam 101 and the size of the beam spot diameter in the sub-scanning direction when the flat to-be-scanned surface element 202 is moved in the Z-axis direction. FIG. 10C illustrates a correlation between the arrival position of the image display beam 101 and the size of the beam spot diameter in the main scanning direction when the longitudinally-curved to-be-scanned surface element 202 is moved in the Z-axis direction. FIG. 10D illustrates a correlation between the arrival position of the image display beam 101 and the size of the beam spot diameter in the sub-scanning direction when the longitudinally-curved to-be-scanned surface element 202 is moved in the Z-axis direction.

The value at the intersection of the solid line illustrated in each of FIGS. 10A to 10D and the vertical axis of the graph is a target value of the beam spot diameter in Example 2. The beam spot diameter of the to-be-scanned surface element 202 according to Example 2 has a target value of 110 µm in the main scanning direction and a target value of 95 µm in the sub-scanning direction.

The values at the intersections of two respective broken lines parallel to the vertical axis illustrated in each of FIGS. 10A to 10D and the horizontal axis of the graph indicate the amounts of movement from the origin. A difference in the amount of movement between the two parallel broken lines indicates an allowable amount of movement of the to-be-scanned surface element 202 in the front-to-back direction, the allowable amount of movement being allowed to satisfy the target value of the beam spot diameter. As illustrated in FIGS. 10A an 10B, if the to-be-scanned surface element 202 is a flat one, the allowable amount of movement in the main scanning direction is approximately 13 mm. By contrast, as illustrated in FIGS. 10C an 10D, the curved to-be-scanned surface element 202 according to the present embodiment has an allowable amount of movement of approximately 15 mm.

Therefore, if the to-be-scanned surface element 202 has the curved shape curved in the main scanning direction (longitudinal direction), the allowable amount of movement of the to-be-scanned surface element 202 in the front-to-back direction with which the beam spot diameter in the main scanning direction has a satisfactory size can be increased.

The allowable amounts of movement of the to-be-scanned surface element 202 in the sub-scanning direction are similarly compared. If the to-be-scanned surface element 202 is a flat one, the allowable amount of movement is approximately 7.2 mm. If the to-be-scanned surface element 202 has the curved shape in the main scanning direction, the allowable amount of movement is approximately 9.6 mm. That is, the to-be-scanned surface element 202 according to the present embodiment can increase the allowable amount of movement in the sub-scanning direction as well.

As described above, the to-be-scanned surface element 202 according to the present embodiment has the curved shape in the main scanning direction. This can increase the allowable value for the displacement of the to-be-scanned surface element 202 when the scanning optical system 200 is assembled. As a result, the robustness increases.

Figure 11A:
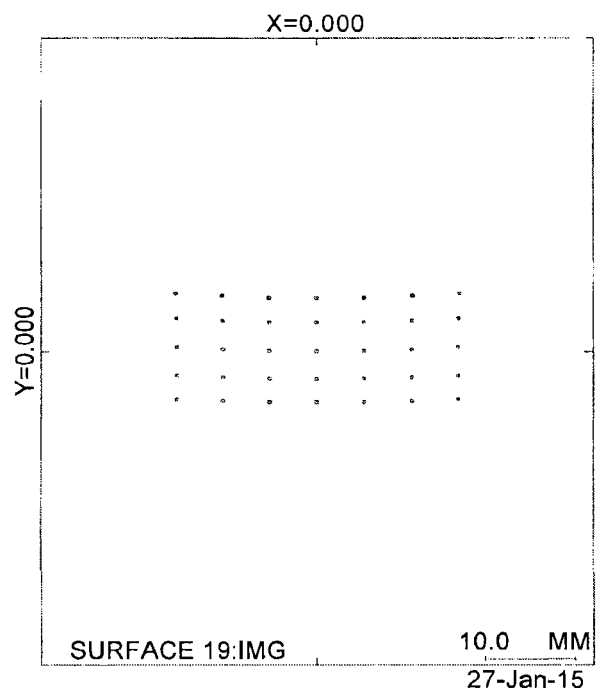
FIG. 11A is a diagram illustrating arrival positions of light on the flat to-be-scanned surface element in Example 2.
Figure 11B:
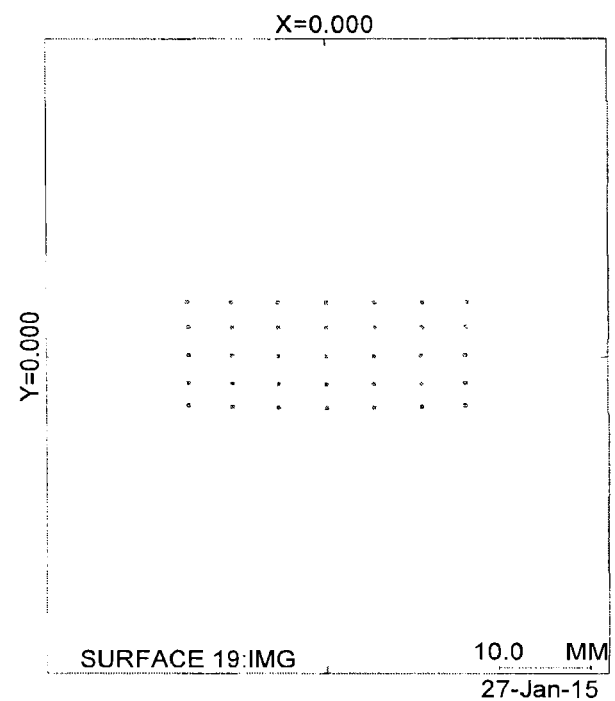
FIG. 11B is a diagram illustrating arrival positions of light on the curved to-be-scanned surface element in Example 2.

Next, the arrival points of light on the to-be-scanned surface element 202 (arrival points of the image display beam 101) will be described by comparison like the foregoing. FIGS. 11A and 11B illustrate the arrival points of light on the to-be-scanned surface element 202 according to combinations of the angles of the micromirrors listed in Table 8. In other words, FIGS. 11A and 11B illustrate a configuration of image formation on the to-be-scanned surface element 202.

FIG. 11A illustrates an example where the to-be-scanned surface 202 has a flat shape. FIG. 11B illustrates an example where the to-be-scanned surface 202 is longitudinally curved. It is shown that if the to-be-scanned surface element 202 has the shape of the curved surface curved in the longitudinal direction (main scanning direction), the distortion of the image (intermediate image) can be made smaller than with a flat surface. Since the image distortion of the magnified virtual image 12 displayed by the virtual image optical system 300 arranged in the subsequent stage of the scanning optical system 200 can be reduced as well, a magnified virtual image 12 of high image quality can be displayed.

According to the HUD 1000 described above, the to-be-scanned surface element 202 is shaped to curve with its convex surface toward the magnifying concave mirror 301 of the virtual image optical system 300. This can suppress variations in the beam spot diameter on the to-be-scanned surface element 202. As a result, the amount of positional adjustment to the to-be-scanned surface element 202 can be increased to control the beam spot diameter within a target range. In other words, the allowable amount of movement of the to-be-scanned surface element 202 can be increased to control the beam spot diameter within the target range.

In addition, distortion of the image on the to-be-scanned surface element 202 can be improved. Since an optical element having power does not need to be arranged between the two-dimensional deflection element 201 and the to-be-scanned surface element 202, a small-sized image display apparatus having high robustness and simple configuration can be provided at low cost.

Curving the image forming unit toward the reflecting mirror can suppress variations in the beam spot diameter on the image forming unit. The allowable amount of movement of the image forming unit for controlling the beam spot diameter within a target range can be increased. Distortion of the image formed on the image forming unit can be improved.

The radius of curvature at the center of the image forming unit corresponding to the longitudinal direction is smaller than the radius of curvature at the center of the image forming unit corresponding to the transverse direction. As a result, image distortion and a drop in resolution, which are likely to occur in the longitudinal direction of the virtual image, can be more effectively improved.

The cylindrical shape of the image forming unit can further improve longitudinal distortion of the image and a drop in resolution.

No optical element having a condensing or diverging effect is included between the optical scanning unit and the image forming unit. As a result, an image display apparatus having high robustness can be provided at low cost.

The optical element that guides converging light to the optical scanning unit has a focal length f of greater than 150 mm at a wavelength of 587.56 nm. The beam spot diameter on the image forming unit can thus be made smaller to display a high-resolution image.

The aperture after the collimator lens for the red light source has an opening area greater than that of the apertures after the collimator lenses for the green and blue light sources. This can increase the input efficiency of light from the red light source.

Lasers and LEDs can be used as the light sources. As compared to the case of using lamps as the light sources, small-sized and long-lived light sources can thus be included, and an image of high color reproducibility can be displayed.

The image display apparatus can be mounted on a moving body so that its driver can recognize alarms and information with less movement of the line of sight.

According to the embodiments described above, a reduction in size and cost can be achieved while maintaining the viewability (quality) of a virtual image.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image display apparatus comprising:
   a light source device including a light source unit;
   a scanning optical system including an image forming unit on which an intermediate image is formed by light from the light source unit; and a virtual image optical system configured to guide light of the intermediate image by using a reflecting mirror and a curved transmissive reflection member, wherein:

the scanning optical system includes an optical scanning unit configured to scan the light from the light source unit in a main scanning direction and a sub-scanning direction of the image forming unit, and the image forming unit is a transmissive member curved in a longitudinal direction of an image displayed on the curved transmissive reflection member.

2. The image display apparatus according to claim 1, wherein |Rx|<|Ry| is satisfied, where Rx is a radius of curvature at a center of the image forming unit corresponding to the longitudinal direction when the intermediate image is displayed on the curved transmissive reflection member, and Ry is a radius of curvature at the center of the image forming unit corresponding to a transverse direction when the intermediate image is displayed on the curved transmissive reflection member.

3. The image display apparatus according to claim 1, wherein an optical length of light incident on one end of the reflecting mirror from the optical scanning unit through one end of the image forming unit is different from an optical length of light incident on another end of the reflecting mirror from the optical scanning unit through an opposite end of the image forming unit.

4. The image display apparatus according to claim 1, wherein the scanning optical system does not include an optical element having a condensing effect or an optical element having a diverging effect between the optical scanning unit and the image forming unit.

5. The image display apparatus according to claim 1, wherein the light source device includes a condensing element for converging light on the optical scanning unit, the condensing element having a focal length f of greater than 150 mm with respect to light having a wavelength of 587.56 nm.

6. The image display apparatus according to claim 1, wherein:

the light source unit includes independent light sources corresponding to red, green, and blue, respectively, and collimator lenses and apertures corresponding to the respective light sources, the collimator lenses and apertures making parallel light emitted from the respective light sources; and the aperture corresponding to the red light source has an opening area greater than both that of the aperture corresponding to the green light source and that of the aperture corresponding to the blue light source.

7. The image display apparatus according to claim 1, wherein the light source unit is a laser or an LED.

8. The image display apparatus according to claim 1, wherein the curved transmissive reflection member is a front windshield of a moving body.

9. An image display apparatus comprising:

a light source device including a light source unit;

a scanning optical system including an image forming unit on which an intermediate image is formed by light from the light source unit; and a virtual image optical system configured to guide light of the intermediate image by using a reflecting mirror and a curved transmissive reflection member, wherein:

the scanning optical system includes an optical scanning unit configured to scan the light from the light source unit in a main scanning direction and a sub-scanning direction of the image forming unit, and the image forming unit is a transmissive member curved along the main scanning direction.

* * * * *